(12) United States Patent
Lee et al.

(10) Patent No.: US 10,500,820 B2
(45) Date of Patent: Dec. 10, 2019

(54) LAMINATING APPARATUS AND LAMINATING METHOD USING THE SAME

(71) Applicant: Samsung Display Co., Ltd., Yongin-si, Gyeonggi-do (KR)

(72) Inventors: Soochan Lee, Asan-si (KR); Hirokazu Ishii, Asan-si (KR); Katsuhiko Tanaka, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 107 days.

(21) Appl. No.: 15/711,990

(22) Filed: Sep. 21, 2017

(65) Prior Publication Data

US 2018/0086034 A1    Mar. 29, 2018

(30) Foreign Application Priority Data

Sep. 26, 2016    (KR) .................. 10-2016-0123239

(51) Int. Cl.
| | |
|---|---|
| B32B 17/10 | (2006.01) |
| B32B 37/06 | (2006.01) |
| B32B 37/12 | (2006.01) |
| B32B 38/00 | (2006.01) |
| B32B 38/10 | (2006.01) |
| B41M 7/00 | (2006.01) |
| B32B 37/00 | (2006.01) |

(Continued)

(52) U.S. Cl.
CPC ........ *B32B 17/10954* (2013.01); *B32B 37/06* (2013.01); *B32B 37/1284* (2013.01); *B32B 38/0004* (2013.01); *B32B 38/10* (2013.01); *B41M 7/0027* (2013.01); *B32B 37/003* (2013.01); *B32B 37/0046* (2013.01); *B32B 37/025* (2013.01); *B32B 38/1858* (2013.01); *B32B 38/1866* (2013.01); *B32B 2315/08* (2013.01); *B32B 2457/20* (2013.01); *G02F 1/1303* (2013.01); *G02F 2001/133331* (2013.01); *H01L 2251/5338* (2013.01); *Y10T 156/1028* (2015.01)

(58) Field of Classification Search
CPC .............. B32B 38/1866; B32B 37/003; B32B 37/0046; B32B 2457/20; B32B 2457/202; B32B 2457/206; B32B 2457/208; H01L 2251/5338; G02F 1/1303; G02F 2001/133331; Y10T 156/1028
See application file for complete search history.

(56) References Cited

U.S. PATENT DOCUMENTS

2014/0002975 A1*  1/2014  Lee ................... H05K 5/0017
                                                   361/679.01
2014/0345791 A1* 11/2014  Son ................... B32B 37/0046
                                                       156/228
2016/0135305 A1    5/2016  Shin

FOREIGN PATENT DOCUMENTS

| KR | 10-2013-0096133 A | 8/2013 |
| KR | 101578442 B1 * | 12/2015 |
| KR | 10-1588600 B1 | 2/2016 |

* cited by examiner

*Primary Examiner* — Carson Gross
(74) *Attorney, Agent, or Firm* — Lewis Roca Rothgerber Christie LLP

(57) ABSTRACT

A laminating apparatus includes: a first jig including at least one curved portion; a second jig opposing the first jig; a pad portion on the second jig; a tube between the first jig and the pad portion, the tube contractable and expandable by a fluid to be injected thereinto; a pressure regulator to regulate a pressure of a fluid injected into the tube; and a fluid moving portion connecting the tube and the pressure regulator. A laminating method is also provided.

9 Claims, 10 Drawing Sheets

(51) Int. Cl.
*B32B 38/18* (2006.01)
*G02F 1/13* (2006.01)
*G02F 1/1333* (2006.01)

LAMINATING APPARATUS AND LAMINATING METHOD USING THE SAME

CROSS-REFERENCE TO RELATED APPLICATION

This application claims priority to and the benefit of Korean Patent Application No. 10-2016-0123239, filed on Sep. 26, 2016 in the Korean Intellectual Property Office, the entire disclosure of which is incorporated by reference herein.

BACKGROUND

1. Field

Aspects of embodiments of the present invention relate to a laminating apparatus and a laminating method using the laminating device.

2. Discussion of Related Art

Display devices may be classified into a liquid crystal display (LCD) device, an organic light emitting diode (OLED) display device, a plasma display panel (PDP) display device, an electrophoretic display device, and the like.

Mobile electronic devices are widely in use. Recently, tablet PCs are widely used as mobile electronic devices in addition to small electronic devices, such as mobile phones.

Such a mobile electronic device includes a display device for providing a user with visual information such as an image or a video in order to support various functions. Recently, as the shapes of electronic devices have become varied, the development of a curved surface display device has become increasingly important, and a laminating apparatus applicable to the curved surface display device and a laminating method using the laminating device are required.

A conventional laminating apparatus for manufacturing a curved surface display device uses an elastic member. In such a case, laminating may be performed by pressurizing a curved portion of the curved surface display device using an elastic member capable of flexibly contracting and expanding.

However, when the elastic member is brought into close contact with the curved portion of the curved surface display device, since the elastic member is deformed in accordance with the shape of the curved portion, the pressure with which the elastic member presses the curved portion may become uneven.

The above information disclosed in this Background portion is only for enhancement of understanding of the background of the inventive concept, and, therefore, it may contain information that does not form the prior art that is already known in this country to a person of ordinary skill in the art.

SUMMARY

According to aspects of exemplary embodiments of the present invention, a laminating apparatus is applicable to a curved surface display device, and a laminating method using the laminating apparatus is provided.

According to an exemplary embodiment, a laminating apparatus includes: a first jig including at least one curved portion; a second jig opposing the first jig; a pad portion on the second jig; a tube between the first jig and the pad portion, the tube contractable and expandable by a fluid to be injected thereinto; a pressure regulator to regulate a pressure of a fluid injected into the tube; and a fluid moving portion connecting the tube and the pressure regulator.

The first jig may have one or more vacuum holes.

The pad portion may have a shape corresponding to the at least one curved portion of the first jig.

The pad portion may include at least one selected from the group consisting of rubber, urethane, a synthetic resin, and silicone.

The tube may include at least one selected from the group consisting of rubber, urethane, a synthetic resin, and silicone.

The fluid may be at least one selected from the group consisting of compressed air, nitrogen, water, and lubricating oil.

The laminating apparatus may further include a clamp between the first jig and the tube to hold a laminating object.

The laminating apparatus may further include a lifting and lowering driving unit to provide a driving force to move the pad portion up and down.

The second jig may have a hole connecting an inner space of the second jig and an outside of the second jig.

The laminating apparatus may further include a vacuum pump connected to the hole to suck air from the inner space of the second jig or to inject air into the inner space of the second jig.

According to another exemplary embodiment, a laminating method includes: arranging a first laminating object on a first jig comprising at least one curved portion; arranging a second laminating object between the first jig and a second jig, the second jig opposing the first jig; at least one of lifting or lowering at least one of the first jig or the second jig to engage the first jig and the second jig and seal an inner space of the first jig and the second jig; decompressing the inner space of the first jig and the second jig to a vacuum state; lifting a pad portion on the second jig such that the first laminating object and the second laminating object closely contact each other; and injecting a fluid into a tube between the pad portion and the second laminating object to pressurize the second laminating object The method may further include discharging the fluid injected into the tube.

The method may further include injecting air into the inner space of the first jig and the second jig, and separating the first jig and the second jig.

The method may further include applying an adhesive layer between the first laminating object and the second laminating object.

The first jig may vacuum-absorb the first laminating object using at least one vacuum hole.

The pad portion may have a shape corresponding to the at least one curved portion of the first jig.

The pad portion may include at least one selected from the group consisting of rubber, urethane, a synthetic resin, and silicone.

The tube may include at least one selected from the group consisting of rubber, urethane, a synthetic resin, and silicone.

The fluid may be at least one selected from the group consisting of compressed air, nitrogen, water, and lubricating oil.

The second laminating object may be held by a clamp.

The foregoing aspects are illustrative only and are not intended to be in any way limiting of the present invention. In addition to the illustrative aspects, exemplary embodiments, and features described above, further aspects, exemplary embodiments, and features will become apparent by reference to the drawings and the following detailed description.

BRIEF DESCRIPTION OF THE DRAWINGS

Aspects of the present invention will become more apparent by describing in further detail some exemplary embodiments thereof with reference to the accompanying drawings, wherein.

DETAILED DESCRIPTION

Figure 1:
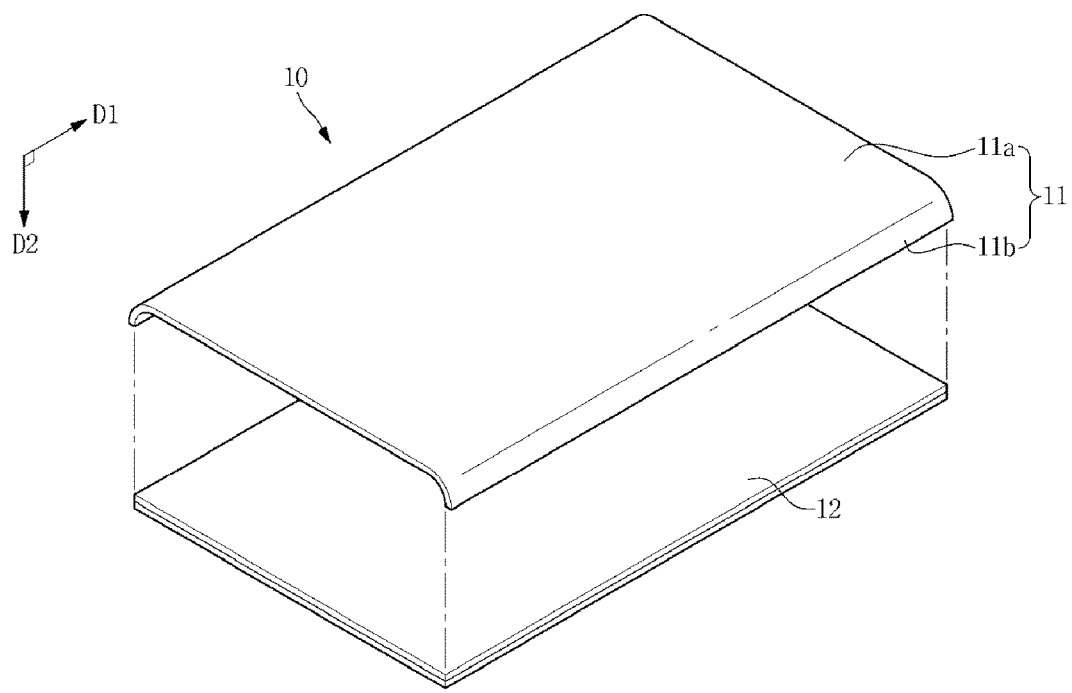
FIG. 1 is a perspective view illustrating a curved display device according to an exemplary embodiment.

Some exemplary embodiments are described more fully herein with reference to the accompanying drawings. Although the present invention may be modified in various manners and have further exemplary embodiments, some exemplary embodiments are illustrated in the accompanying drawings and will be mainly described in the specification. However, the scope of the present invention is not limited to the illustrated exemplary embodiments and is to be understood to include all changes, equivalents, and substitutions included in the spirit and scope of the present invention.

In the drawings, thicknesses of a plurality of layers and/or areas may be illustrated in an enlarged manner for clarity and ease of description thereof. When a layer, area, or plate is referred to as being "on" another layer, area, or plate, it may be directly on the other layer, area, or plate, or one or more intervening layers, areas, or plates may be present therebetween. Conversely, when a layer, area, or plate is referred to as being "directly on" another layer, area, or plate, intervening layers, areas, or plates may be absent therebetween. Further when a layer, area, or plate is referred to as being "below" another layer, area, or plate, it may be directly below the other layer, area, or plate, or one or more intervening layers, areas, or plates may be present therebetween. Conversely, when a layer, area, or plate is referred to as being "directly below" another layer, area, or plate, intervening layers, areas, or plates may be absent therebetween.

The spatially relative terms "below," "beneath," "less," "above," "upper," and the like, may be used herein for ease of description to describe the relations between one element or component and another element or component as illustrated in the drawings. It is to be understood that the spatially relative terms are intended to encompass different orientations of the device in use or operation, in addition to the orientation depicted in the drawings. For example, in the case where a device shown in the drawing is turned over, the device positioned "below" or "beneath" another device may be placed "above" another device. Accordingly, the illustrative term "below" may include both the lower and upper positions. The device may also be oriented in the other direction, and thus the spatially relative terms may be interpreted differently depending on the orientations.

Throughout the specification, when an element is referred to as being "connected" to another element, the element may be "directly connected" to the other element, or "electrically connected" to the other element with one or more intervening elements interposed therebetween. It is to be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

It is to be understood that, although the terms "first," "second," "third," and the like may be used herein to describe various elements, these elements should not be limited by these terms. These terms are only used to distinguish one element from another element. Thus, "a first element" discussed below could be termed "a second element" or "a third element," and "a second element" and "a third element" may be termed likewise without departing from the teachings herein.

Unless otherwise defined, all terms used herein (including technical and scientific terms) have the same meaning as commonly understood by those skilled in the art to which this invention pertains. It is to be further understood that terms, such as those defined in commonly used dictionaries, should be interpreted as having a meaning that is consistent with their meaning in the context of the relevant art and are not to be interpreted in an ideal or excessively formal sense unless clearly defined in the present specification.

Some parts which are not associated with the description may not be provided in order to specifically describe exemplary embodiments of the present invention, and like reference numerals refer to like elements throughout the specification.

FIG. 1 is a perspective view illustrating a curved display device according to an exemplary embodiment.

Referring to FIG. 1, a curved display device 10 according to an exemplary embodiment may include a window panel 11 and a display panel 12.

The window panel 11 may be a transparent planar-shaped member, and may include a transparent material, such as glass, polyethylene terephthalate (PET), or acryl, for example. As used herein, the term "transparent" may be understood to include perfect transmittance that passes 100% of light and semi-transmittance that partially passes light.

The window panel 11 according to an exemplary embodiment may include a flat surface portion 11a and a curved surface portion 11b. In an embodiment, the window panel 11 may include curved surface portions 11b extending in a first direction D1 and the flat surface portion 11a positioned between the curved surface portions 11b. In other words, the curved surface portion 11b may be curved from opposite sides of the flat surface portion 11a to extend therefrom.

The display panel 12 may be a display panel on which an image is displayed. In an exemplary embodiment, the display panel 12 may be a display panel for displaying an image, and may include a liquid crystal display ("LCD") panel, an electrophoretic display panel, an organic light emitting diode ("OLED") panel, a light emitting diode ("LED") panel, an inorganic electro luminescent ("EL") display panel, a field emission display ("FED") panel, a surface conduction electron-emitter display ("SED") panel, a plasma display panel ("PDP"), a cathode ray tube ("CRT") display panel, or the like.

However, the types of the display panel described above are merely described by way of example, and the types of the display panel are not limited thereto. Further, the display panel may be understood to include not only a rigid panel, but also a flexible panel capable of being bent, folded, and/or rolled.

In addition, although not illustrated, the display panel 12 may be understood to include a touch screen panel (TSP). The TSP may be understood to include any of known touch panels.

In an exemplary embodiment, whereby the window panel 11 includes the flat surface portion 11a and the curved surface portion 11b, the display panel 12 may be curved in accordance with the shape of the window panel 11. That is, in a state in which the window panel 11 and the display panel 12 are laminated, the window panel 11 and the display panel 12 may overlap (e.g., completely overlap) each other. To this end, the display panel 12 may at least partially have flexibility. That is, a portion of the display panel 12 corresponding to the curved surface portion 11b of the window panel 11 may be partially curved.

In addition, although not illustrated, an adhesive layer may be disposed between the window panel 11 and the display panel 12. The adhesive layer may use a thermal curable adhesive or a UV curable adhesive. However, exemplary embodiments are not limited thereto, and an optically clear adhesive (OCA) or an optically clear resin (OCR) tape may also be used.

Herein, a laminating apparatus according to an exemplary embodiment will be described. The laminating apparatus according to an exemplary embodiment is described on the premise that a display panel 12 having a flat shape is attached to a window panel 11 of a portrait type that has a transverse length less than a longitudinal length and that is curved in the longitudinal direction. However, exemplary embodiments are not limited thereto, and the laminating apparatus according to an exemplary embodiment may be applied to a window panel 11 of a landscape type that has a transverse direction longer than a longitudinal direction and that is curved in the transverse direction.

Further, the laminating apparatus according to an exemplary embodiment is described for purposes of illustration as attaching the window panel 11 and the display panel 12, but it may be applied to any case in which a rigid material having a curved portion is attached to a flexible material, without particular limitation.

Figure 2:
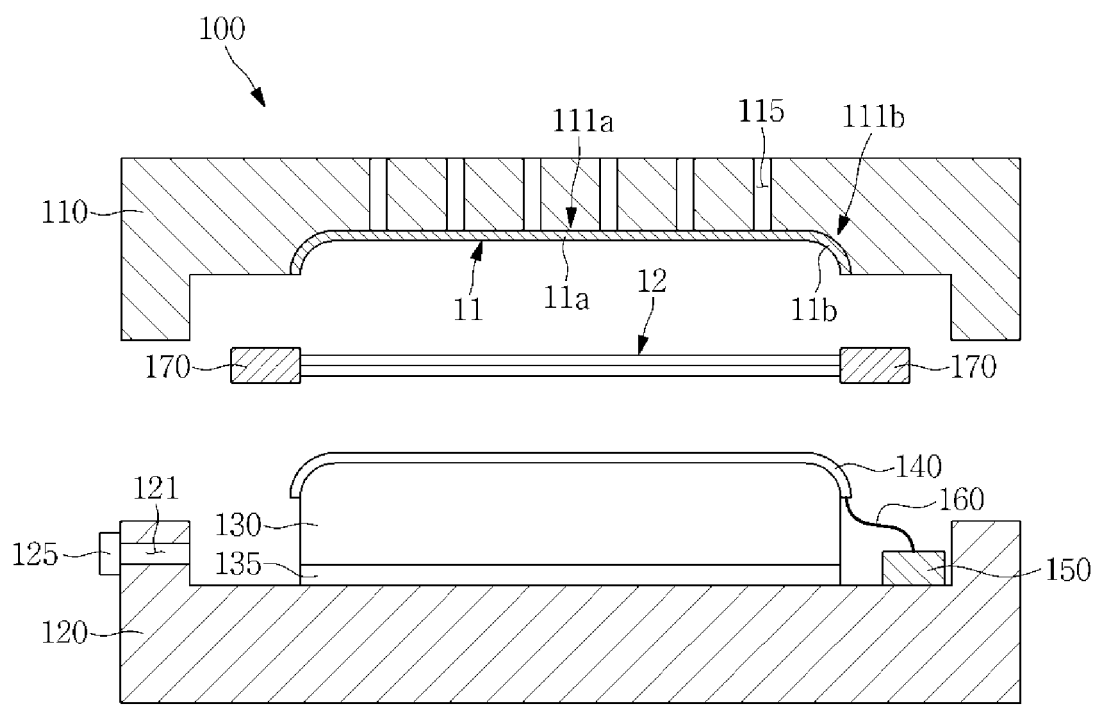
FIG. 2 is a cross-sectional view illustrating a laminating apparatus according to an exemplary embodiment.
Figure 3:
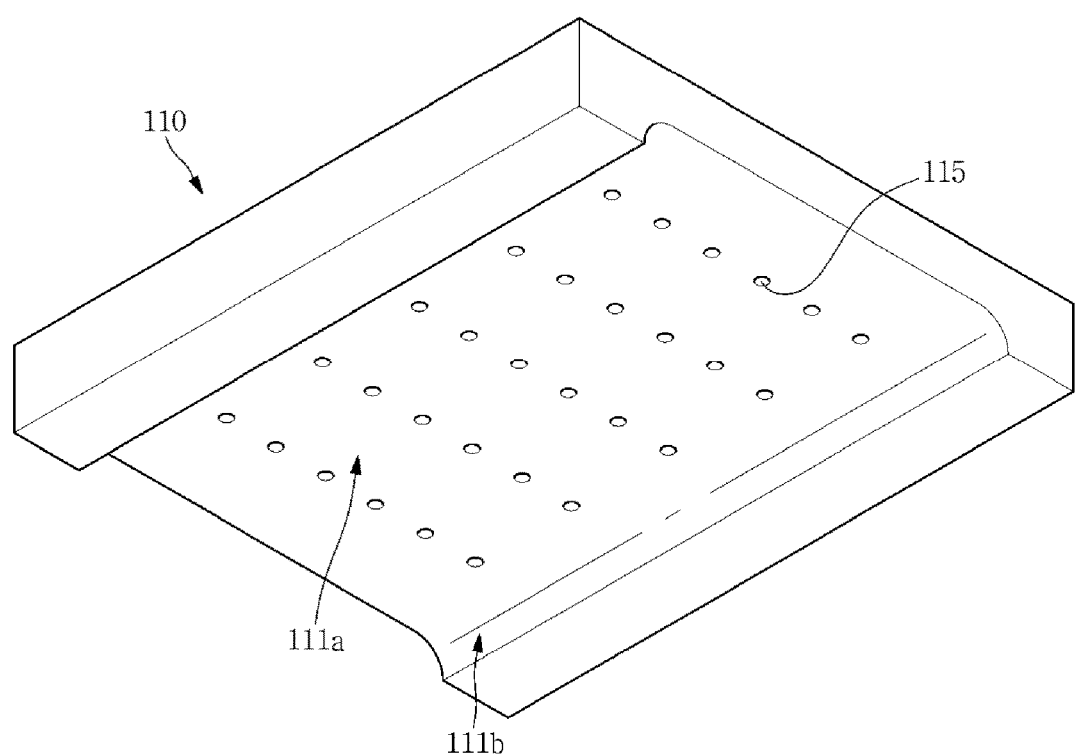
FIG. 3 is a perspective view illustrating a first jig of a laminating apparatus according to an exemplary embodiment.

FIG. 2 is a cross-sectional view illustrating a laminating apparatus according to an exemplary embodiment; FIG. 3 is a perspective view illustrating a first jig of a laminating apparatus according to an exemplary embodiment; and FIG. 4 is a perspective view illustrating a second jig of a laminating apparatus according to an exemplary embodiment.

Figure 4:
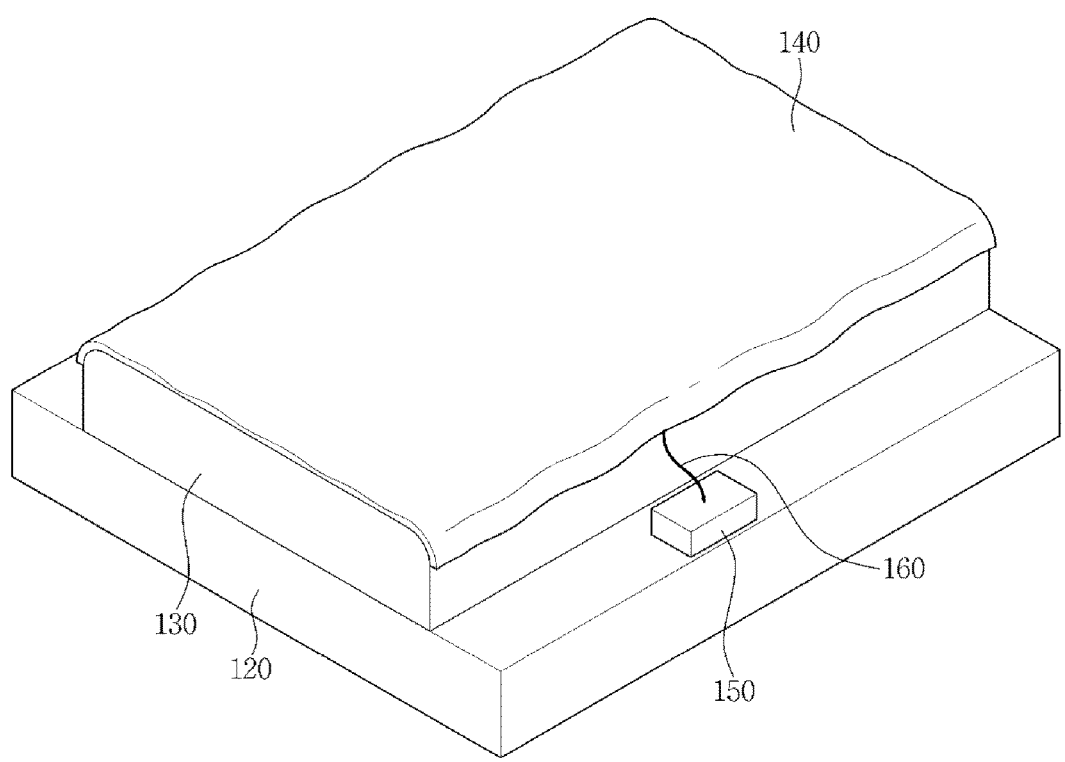
FIG. 4 is a perspective view illustrating a second jig of a laminating apparatus according to an exemplary embodiment.

Referring to FIGS. 2, 3, and 4, a laminating apparatus 101 according to an exemplary embodiment includes: a first jig 110 including at least one curved portion 111b; a second jig 120 disposed to oppose the first jig 110; a pad portion 130 on the second jig 120; a tube 140 disposed between the first jig 110 and the pad portion 130, and contracting and expanding by a fluid to be injected thereinto; a pressure regulating unit 150 regulating a pressure of the fluid to be injected into the tube 140; a fluid moving portion 160 connecting the tube 140 and the pressure regulating unit 150; a clamp 170 disposed between the first jig 110 and the tube 140, and fastening or holding a laminating object, and the like.

The first jig 110 may fasten or hold a first laminating object. The first laminating object may be, for example, the window panel 11, including a rigid material, having a curved surface. The first jig 110 may fasten or hold the window panel 11 using, for example, a vacuum adsorption method. However, a fastening device or method according to the present invention is not limited thereto.

In an embodiment, a lower surface of the first jig 110 may have a size and a shape corresponding to the window panel 11. That is, in an exemplary embodiment in which the window panel 11 includes the flat surface portion 11a and the curved surface portion 11b, the first jig 110 may include a flat portion 111a corresponding to the flat surface portion 11a of the window panel 11, and a curved portion 111b corresponding to the curved surface portion 11b of the window panel 11.

In an embodiment, the first jig 110 may have at least one vacuum hole 115 for vacuum-adsorbing the window panel 11. The at least one vacuum hole 115 may be connected to a vacuum pump (not illustrated), and the vacuum pump (not illustrated) may provide a force necessary for adsorption.

The first jig 110 may further include a separate driving unit (not illustrated) for moving up and down in a vertical direction.

The second jig 120 may be disposed so as to oppose the first jig 110.

The second jig 120 may have at least one hole 121 connecting an inner space and the outside. The hole 121 may be provided with a vacuum pump 125 for sucking out air from or injecting air into the inner space. In an exemplary embodiment, the hole 121 connecting the inner space and the outside is illustrated as being defined in the second jig 120, but exemplary embodiments are not limited thereto. That is, in another exemplary embodiment, the hole 121 may be defined in the first jig 110.

The pad portion 130 may be disposed on the second jig 120.

An upper surface of the pad portion 130 may have a shape corresponding to the lower surface of the first jig 110. That is, in an embodiment, the pad portion 130 may have a shape corresponding to the flat portion 111a and the curved portion 111b of the first jig 110.

The pad portion 130 may include a material having an elastic force and a restoring force. That is, the shape of the pad portion 130 may be changed according to the applied force, and when the applied force is removed, the pad portion 130 may be restored to a state or shape before application of the force.

In an embodiment, the pad portion 130 may include at least one material selected from the group consisting of rubber, urethane, a synthetic resin, and silicone. However, exemplary embodiments are not limited thereto, and any suitable elastic material that is currently developed, commercialized, or may be implemented according to future technological developments may be used.

The tube 140 may be disposed on the pad portion 130. The tube 140 may have a substantially same size and shape as those of the upper surface of the pad portion 130.

In an embodiment, the pad portion 130 may further include a lifting and lowering driving unit 135 for providing a driving force for lifting and lowering the pad portion 130. The lifting and lowering driving unit 135 may move the pad portion 130 up and down in a vertical direction.

The tube 140 may contract and expand due to the fluid being injected thereinto. In an embodiment, the fluid injected into the tube 140 may include a fluid selected from the group consisting of compressed air, nitrogen, water, and oil (e.g., lubricating oil). However, exemplary embodiments are not limited thereto, and any generally used or suitable fluid may be used without limitation.

In an embodiment, the tube 140 may include any one or more materials selected from the group consisting of rubber, urethane, a synthetic resin, and silicone. However, exemplary embodiments are not limited thereto, and any suitable elastic material that is currently developed, commercialized, or may be implemented according to future technological developments may be used.

The pressure regulating unit 150 may adjust the pressure of the tube 140 by adjusting the amount of fluid injected into the tube 140. The pressure regulating unit 150 may receive the fluid from an external fluid supply (not illustrated). In an embodiment, a plurality of pressure regulating units 150 may be provided, and in such an exemplary embodiment, the amount of fluid injected into or discharged from the tube 140 may be controlled at a higher speed.

The fluid moving portion 160 connects the tube 140 and the pressure regulating unit 150 and may inject a fluid into or discharge the fluid from the tube 140. In an embodiment, a plurality of fluid moving portions 160 may be provided, and in such an exemplary embodiment, the amount of fluid injected into or discharged from the tube 140 may be controlled at a higher speed.

The clamp 170 may fasten or hold opposite ends of a second laminating object, such as the display panel 12, for example. In an embodiment, opposite ends of the display panel 12 are pulled in a horizontal direction by the clamp 170, such that the display panel 12 may be maintained in a tightened state. That is, the clamp 170 may apply a tension in the horizontal direction to the display panel 12. In an embodiment, the clamp 170 may move up and down in the vertical direction. The clamp 170 may be driven with a physical or electrical force.

FIGS. 5, 6, 7, 8, 9, and 10 are explanatory views illustrating a laminating method according to an exemplary embodiment.

Figure 5:
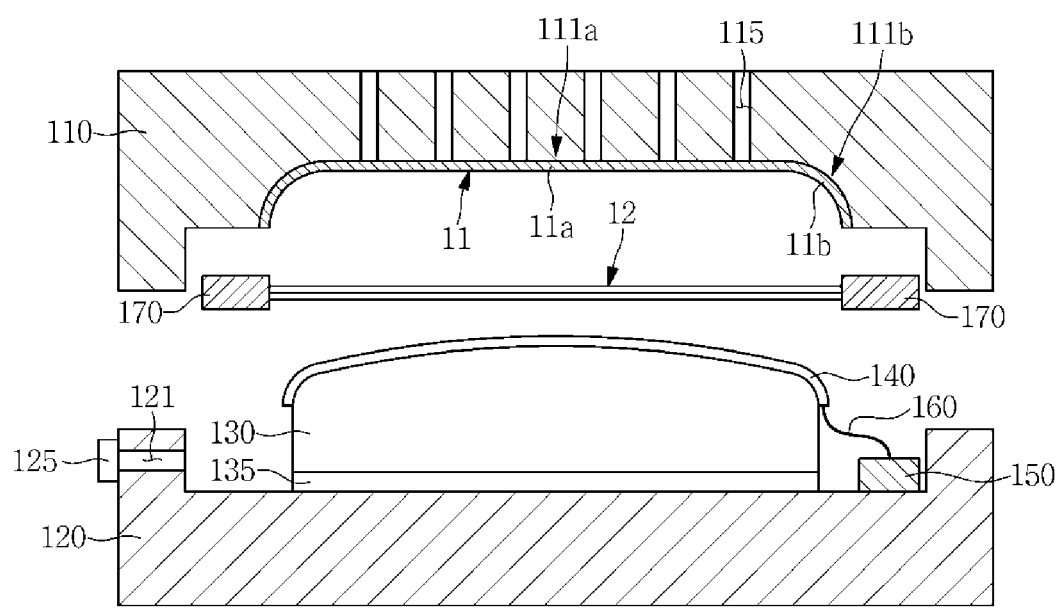
FIGS. 5, 6, 7, 8, 9, and 10 are explanatory views illustrating a laminating method according to an exemplary embodiment.

Referring to FIG. 5, the window panel 11 may be fastened or held on the first jig 110, and the display panel 12 may be fastened or held between the first jig 110 and the second jig 120 by the clamp 170. An adhesive layer (not illustrated) may be further disposed between the window panel 11 and the display panel 12.

As described above, the first jig 110 may fasten or hold the window panel 11 by a vacuum adsorption method using the at least one vacuum hole 115. However, the fastening method is not limited thereto.

Figure 6:
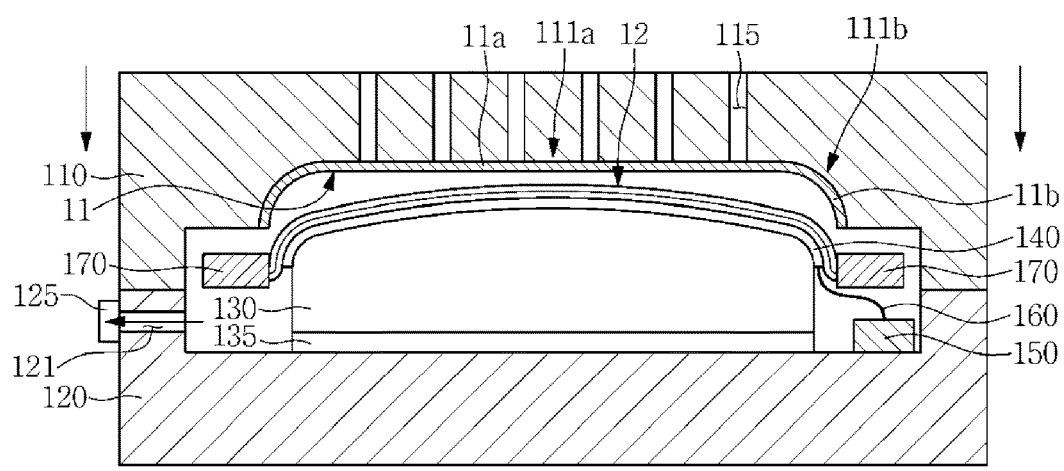

Subsequently, referring to FIG. 6, the first jig 110 descends toward the second jig 120 such that the first jig 110 and the second jig 120 are engaged with each other and, thus, an inner space of the first jig 110 and the second jig 120 may be sealed. In addition, the vacuum pump 125 may suck the air in the inner space and may reduce a pressure of the inner space of the first jig 110 and the second jig 120 to a vacuum state.

However, exemplary embodiments are not limited thereto. In an exemplary embodiment, the second jig 120 may ascend toward the first jig 110, or the first jig 110 and the second jig 120 may descend and ascend, respectively, such that the first jig 110 and the second jig 120 may be engaged with each other.

In an embodiment, the inner space of the first jig 110 and the second jig 120 is depressurized to a vacuum state such that foreign substances or air bubbles may be prevented or substantially prevented from permeating between the window panel 11 and the display panel 12 in the process of attaching the window panel 11 to the display panel 12.

Figure 7:
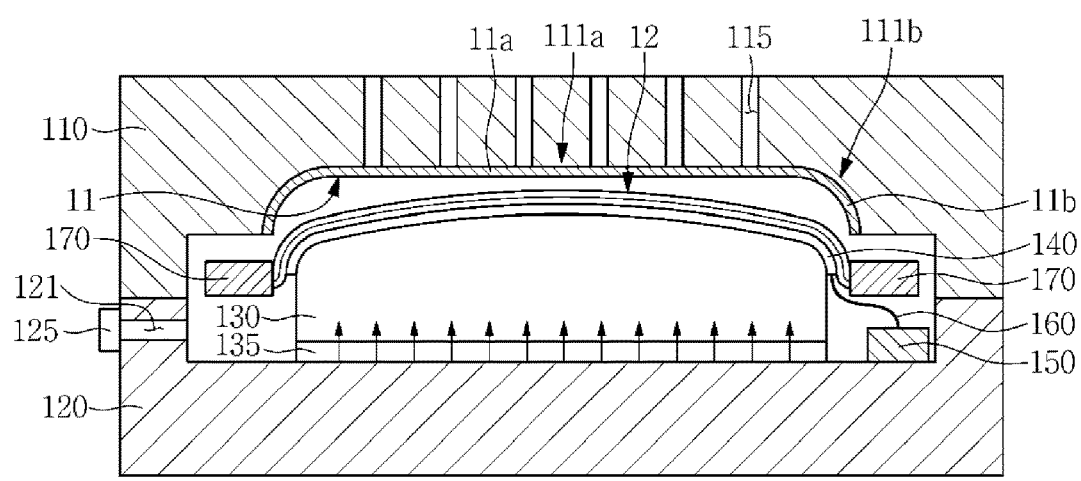

In an embodiment, referring to FIG. 7, the pad portion 130 is subsequently lifted by the lifting and lowering driving unit 135 to bring the display panel 12 into close contact with the window panel 11.

Figure 8:
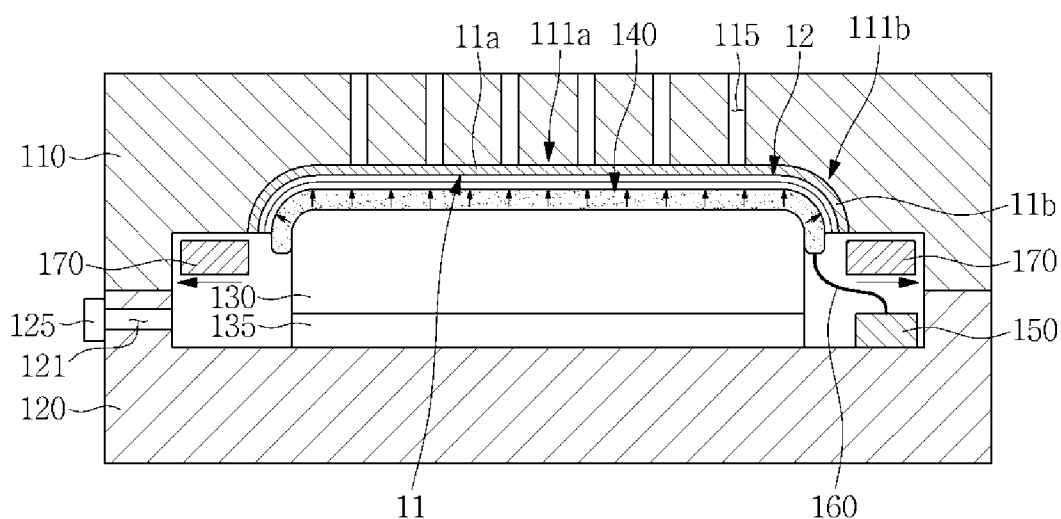

In an embodiment, referring to FIG. 8, a fluid is subsequently injected into the tube 140 disposed above the pad portion 130 to inflate it. In an embodiment, the fluid injected into the tube 140 may include any selected from the group consisting of compressed air, nitrogen, water, and oil (e.g., lubricating oil). In such an exemplary embodiment, the clamp 170 may be removed from the display panel 12.

In an embodiment, the tube 140 may include any one or more materials selected from the group consisting of rubber, urethane, a synthetic resin, and silicone. A pressure applied from the pad portion 130 by the fluid injected into the tube 140 may be uniformly distributed through an entire area of the display panel 12. That is, the pressure may be uniformly applied to the entire area of the display panel 12 that is bonded to the flat surface portion 11a and the curved surface portion 11b of the window panel 11.

The laminating apparatus according to an exemplary embodiment may provide a uniform pressure to the entire area of the display panel 12, thus enhancing the uniformity of laminating, by disposing, between the display panel 12 and the pad portion 130, the tube 140 that may contract and expand by the injected fluid.

Figure 9:
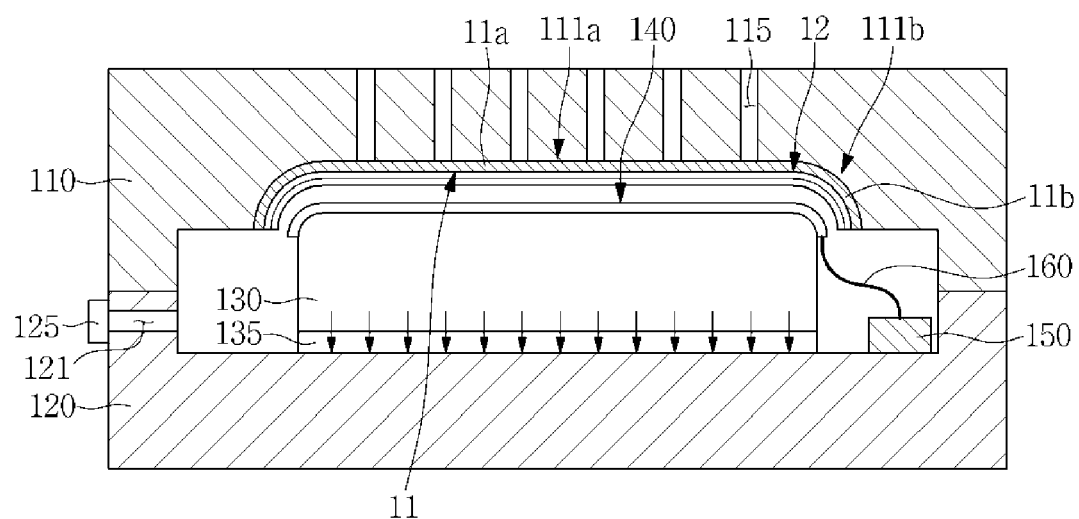

Subsequently, referring to FIG. 9, after the fluid is discharged from the tube 140, thereby contracting the tube 140, the pad portion 130 is lowered by the lifting and lowering driving unit 135 such that attachment of the window panel 11 and the display panel 12 may be completed.

Figure 10:
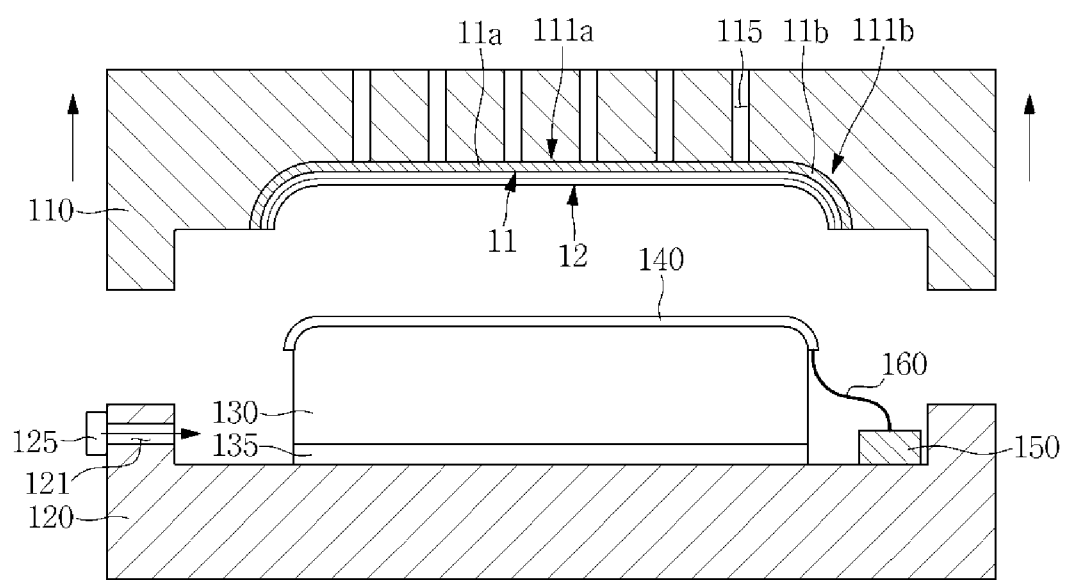

In an embodiment, referring to FIG. 10, after an external air is injected into the inner space of the first and second jigs 110 and 120 by using the vacuum pump 125, the first jig 110 and the second jig 120 may be separated from each other.

As set forth herein, in one or more exemplary embodiments, the laminating apparatus and the laminating method using the laminating apparatus may improve the uniformity of laminating by providing a uniform pressure to the curved portion of the curved display device.

While the present invention has been illustrated and described with reference to some exemplary embodiments thereof, it will be apparent to those of ordinary skill in the art that various changes in form and detail may be made thereto without departing from the spirit and scope of the present invention.

What is claimed is:

1. A laminating apparatus comprising:
   a first jig comprising at least one curved portion;
   a second jig opposing the first jig;
   a pad portion on the second jig;
   a tube between the first jig and the pad portion, the tube contractable and expandable by a fluid to be injected thereinto;
   a pressure regulator to regulate a pressure of a fluid injected into the tube; and
   a fluid moving portion connecting the tube and the pressure regulator,
   wherein one of the first and second jigs has a hole connecting an inner space of the laminating apparatus and an outside of the laminating apparatus, the inner space being between facing surfaces of the first and second jigs.

2. The laminating apparatus as claimed in claim 1, wherein the first jig has one or more vacuum holes.

3. The laminating apparatus as claimed in claim 1, wherein the pad portion has a shape corresponding to the at least one curved portion of the first jig.

4. The laminating apparatus as claimed in claim 1, wherein the pad portion comprises at least one selected from the group consisting of rubber, urethane, a synthetic resin, and silicone.

5. The laminating apparatus as claimed in claim 1, wherein the tube comprises at least one selected from the group consisting of rubber, urethane, a synthetic resin, and silicone.

6. The laminating apparatus as claimed in claim 1, wherein the fluid is at least one selected from the group consisting of compressed air, nitrogen, water, and lubricating oil.

7. The laminating apparatus as claimed in claim 1, further comprising a clamp between the first jig and the tube to hold a laminating object.

8. The laminating apparatus as claimed in claim 1, further comprising a vacuum pump connected to the hole to suck air from the inner space or to inject air into the inner space.

9. A laminating apparatus comprising:
a first jig comprising at least one curved portion;
a second jig opposing the first jig;
a pad portion on the second jig;
a tube between the first jig and the pad portion, the tube contractable and expandable by a fluid to be injected thereinto;
a pressure regulator to regulate a pressure of a fluid injected into the tube;
a fluid moving portion connecting the tube and the pressure regulator; and
a lifting and lowering driving unit to provide a driving force to move the pad portion up and down relative to the second jig.

* * * * *